US006477674B1

United States Patent
Bates et al.

(10) Patent No.: US 6,477,674 B1
(45) Date of Patent: Nov. 5, 2002

(54) METHOD AND APPARATUS FOR CONDUCTING INPUT/OUTPUT LOOP BACK TESTS USING A LOCAL PATTERN GENERATOR AND DELAY ELEMENTS

(75) Inventors: Sarah E. Bates, Palo Alto, CA (US); R. Tim Frodsham, Portland, OR (US); Nasser A. Kurd, Hillsboro, OR (US); Anne Meixner, Portland, OR (US); David J. O'Brien, Portland, OR (US); Rajay R. Pai, Beaverton, OR (US); Mike Tripp, Forest Grove, OR (US); Jeff Wight, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,874

(22) Filed: Dec. 29, 1999

(51) Int. Cl.[7] ................................................. G06F 11/00
(52) U.S. Cl. ....................................................... 714/738
(58) Field of Search ................................ 714/718, 738; 324/763–765

(56) References Cited

U.S. PATENT DOCUMENTS 5,225,774 A * 7/1993 Imamura ................. 324/158.1
5,230,001 A * 7/1993 Chandra et al. ............ 714/738
5,459,733 A * 10/1995 Alapat ....................... 714/718
5,621,739 A 4/1997 Sine et al.
5,869,983 A 2/1999 Ilkbahar et al.

OTHER PUBLICATIONS

Choi et al., Divide and Conquer in Wafer Scale Array Testing, IEEE, p. 265–271, 1990.*

* cited by examiner

Primary Examiner—Albert Decady
Assistant Examiner—Shelly A Chase
(74) Attorney, Agent, or Firm—Blakely, Sokoloff, Taylor & Zafman LLP

(57) ABSTRACT

In one embodiment, an integrated circuit including a plurality of input/output (I/O) buffers is disclosed. The integrated circuit contains a plurality of I/O buffers. Each of the I/O buffers include an I/O test circuit that generates test pattern signals whenever the integrated circuit is operating in a loopback test mode. According to a further embodiment, the integrated circuit includes one or more programmable delay circuits coupled to the I/O buffers that permit switching state (AC) loopback timing tests to be conducted.

37 Claims, 5 Drawing Sheets

METHOD AND APPARATUS FOR CONDUCTING INPUT/OUTPUT LOOP BACK TESTS USING A LOCAL PATTERN GENERATOR AND DELAY ELEMENTS

FIELD OF THE INVENTION

The present invention relates to testing the correct operation of integrated circuits; more particularly, the present invention relates to testing an input/output circuit in an integrated circuit.

BACKGROUND

Before an integrated circuit (IC) may be used in an application, it is typically necessary to verify the proper functionality and timing of components within each input/output (I/O) circuit of the IC. Verifying the functionality of an IC is typically accomplished by placing the IC on a tester that includes a tester channel for each I/O pin on the IC. Subsequently, each I/O buffer coupled to an I/O pin is tested for functionality, timing, performance, etc. However, there are often problems associated with testing an IC in this manner. One problem is that testing each I/O pin on an IC is time consuming and often expensive due to test equipment costs. Another problem is that the speed of the test equipment is typically not fast enough to keep pace with the IC. Moreover, existing test equipment is not capable of testing high-speed source synchronous systems.

In order to solve the problems of exclusively using a tester to test an IC, several contemporary testing schemes use the IC to assist in the testing. This process is commonly referred to as an I/O loopback test. I/O loopback tests are typically carried out by providing data from a functional logic block (or FLB) within the IC (e.g., a microprocessor), and driving the data out through the output component of each I/O buffer. Subsequently, the data is driven back through the input component of the I/O buffer to the FLB in order to verify to that the correct data has been received. Consequently, the IC verifies whether the input and output components of each I/O buffer is functioning properly.

The problem with conventional I/O loopback tests, however, is that generating and verifying test data patterns at the FLB require the addition of special logic within the FLB. Further, since the FLB is required to generate and check data, it is not possible to conduct other tests within the IC (e.g., the effect of I/O data on the FLB or vice versa). Therefore, a method and apparatus for performing an I/O loopback test without using core logic within a FLB is desired.

SUMMARY OF THE INVENTION

An integrated circuit including a plurality of input/output (I/O) buffers is disclosed. In one embodiment, the integrated circuit contains a first I/O buffer that includes a first I/O pad, a first output driver coupled to the first I/O pad and a first input receiver coupled to the first I/O pad. In addition, the first I/O buffer includes a first I/O test circuit coupled to the first output driver and the first input receiver, wherein the first I/O test circuit generates test pattern signals whenever the first I/O test circuit is operating in a test mode.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A method and apparatus for performing I/O loopback tests wherein I/O circuitry tests itself independent of a system processor is described. In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order not to unnecessarily obscure the present invention.

Figure 1:
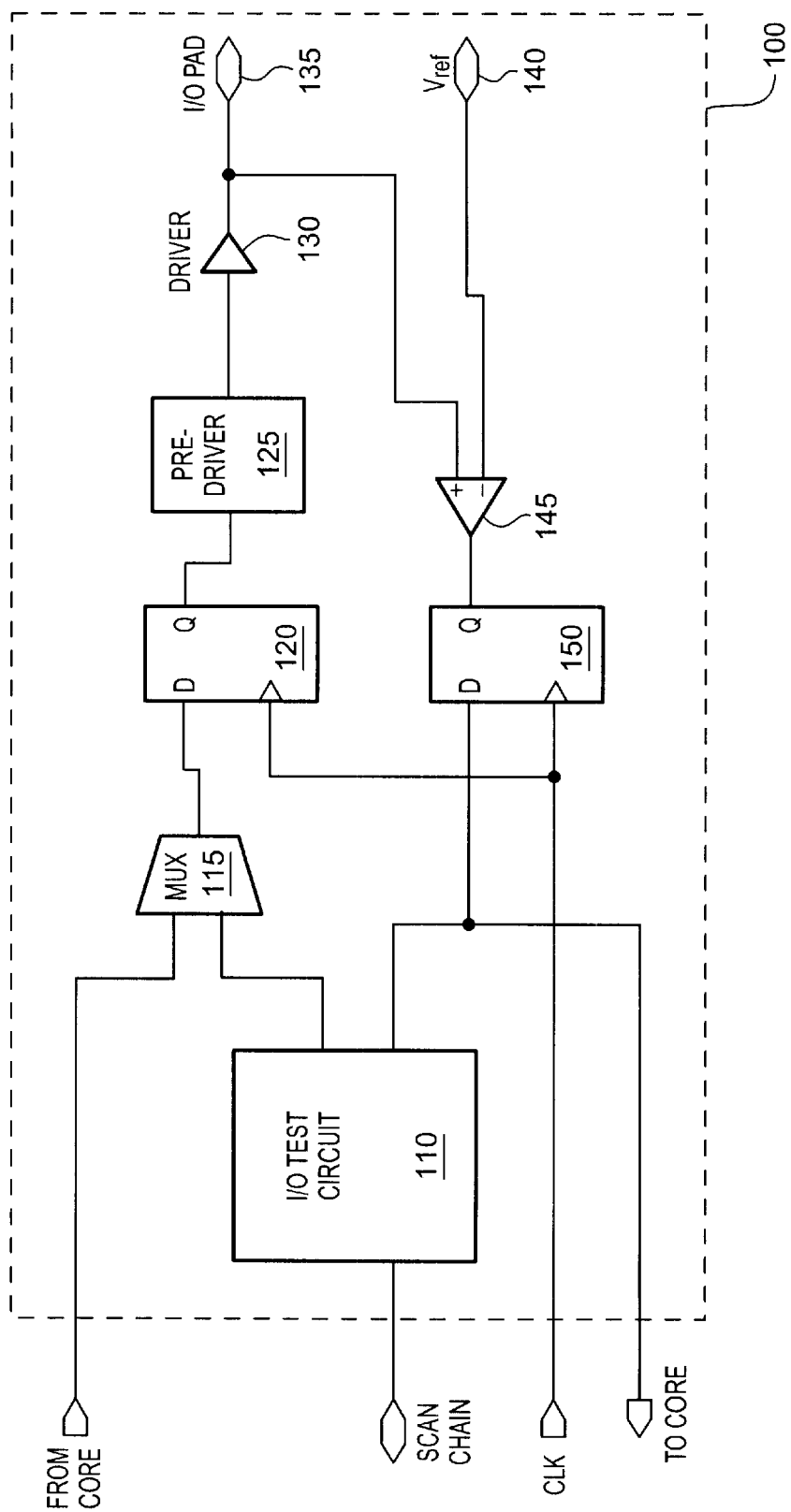
FIG. 1 is a block diagram of one embodiment of an input/output buffer for common clock operation.

FIG. 1 is a block diagram of one embodiment of an input/output (I/O) buffer 100. I/O buffer 100 includes an I/O test circuit 110, a multiplexer (MUX) 115, and a register 120. Further, I/O buffer 100 includes pre-driver circuit 125, an output driver 130, an I/O pad 135, a voltage reference pad ($V_{REF}$) 140, an operational amplifier 145 and a register 150. According to one embodiment, I/O buffer 100 operates in a common clock mode.

I/O test circuit 110 generates test signals for the testing of other components within I/O buffer 100. Additionally, I/O test circuit 110 receives the test signals after the signals have propagated through I/O buffer 100 and compares them to the data that was initially transmitted. MUX 115 is coupled to I/O test circuit 110 and selects between test signals transmitted from I/O test circuit 110 and data received at I/O buffer 100 from the core of an integrated circuit (CORE). MUX 115 selects signals from I/O test circuit 110 whenever I/O buffer 110 is operating in a loopback or switching state (AC) loopback test mode. The CORE data path is selected whenever I/O buffer 110 is operating in a normal mode. One of ordinary skill in the art will appreciate that other selection circuits may be used to select between the CORE and test data paths, and that this MUX may be placed in other positions in the data path.

Register 120 is coupled to MUX 115 and captures data that is received from I/O test circuit 110 or the CORE in order to synchronize the received data with the system clock. Pre-driver 125 is coupled to register 120. Pre-driver 125 transmits data signals that are to be transmitted from I/O buffer 100. Driver 130 is coupled to pre-driver 125 and operates by amplifying data signals received from pre-driver 125 before they are transmitted from I/O buffer 100. I/O pad 135 is coupled to driver 130. In normal operation, I/O pad 135 receives data from other circuits coupled to I/O buffer 100 and transmits data from I/O buffer 100 to the other circuits.

$V_{REF}$ pad 140 receives an external reference voltage. Differential amplifier (amp) 145 is coupled to I/O pad 135 and $V_{REF}$ pad 140. Amp 145 aggregates signals received from I/O pad 135 and $V_{REF}$ pad 140 into a single signal. According to one embodiment, amp 145 transmits a logical one whenever a signal received at I/O pad 135 is higher in magnitude than a signal received at $V_{REF}$ pad 140. Additionally, amp 145 transmits a logical zero whenever a signal received at I/O pad 135 is lower in magnitude than a signal received at $V_{REF}$ pad 140. One of ordinary skill in the art will appreciate that the operation of amp 145 may be reversed.

Register 150 is coupled to Amp 145 and captures data that is received from I/O pad 135 in order to synchronize the received data with the system core clock. Amp 145 and register 150 are typically referred to as the input (or receiver) portion of I/O buffer 100. In another embodiment, Amp 145 and register 150 may be combined to form a latched sense amp. However, one of ordinary skill in the art will appreciate that other input structures, such as a simple CMOS gate, may be used.

Figure 2:
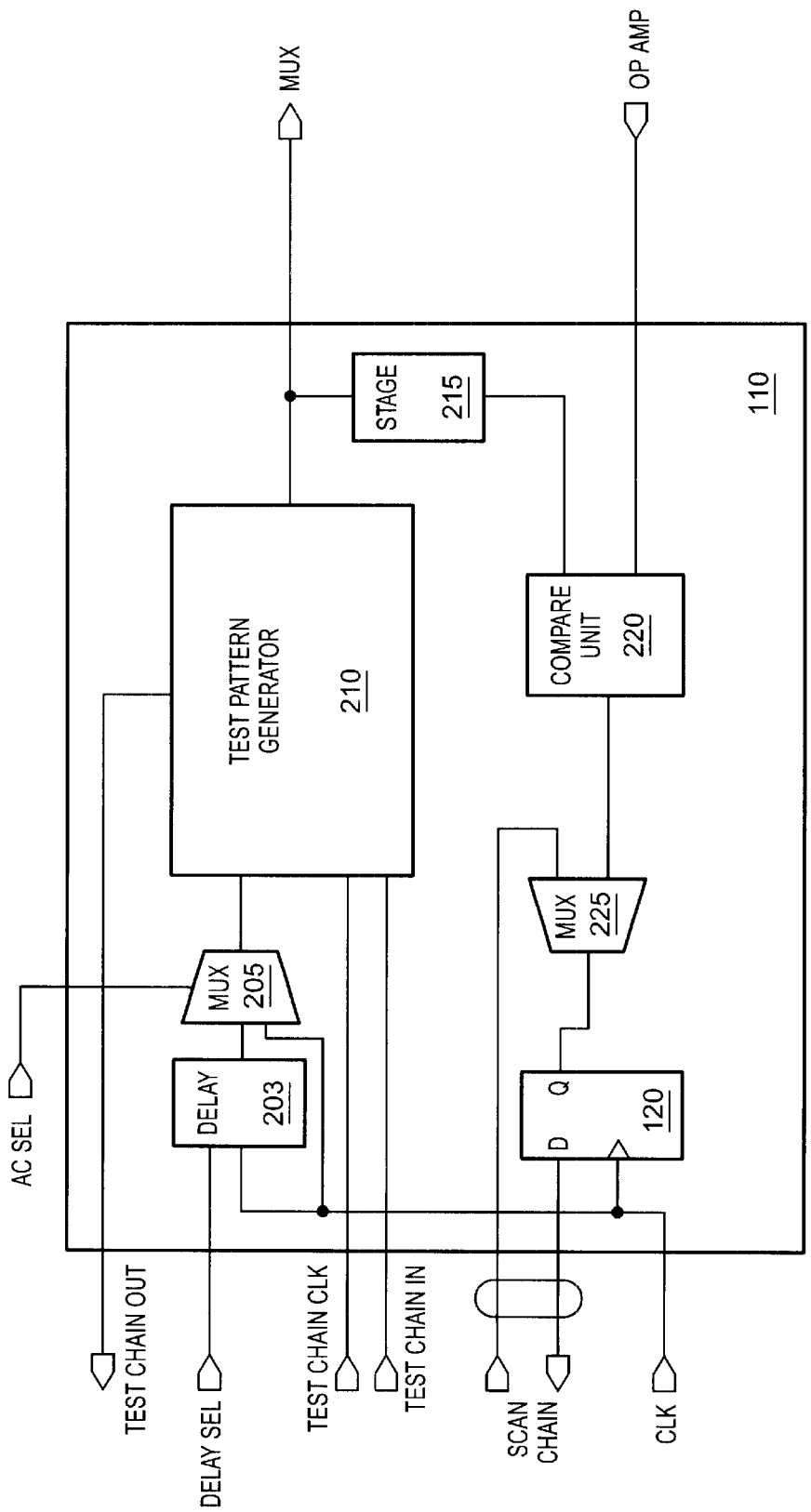
FIG. 2 is a block diagram of one embodiment of an input/output test circuit.

FIG. 2 is a block diagram of one embodiment of I/O test circuit 110. I/O test circuit 110 includes a delay unit 203, a MUX 205, a test pattern generator 210, a stage unit 215, a compare unit 220, a MUX 225 and a latch 230. Delay unit 203 provides a delay of core clock signals received at I/O test circuit 110 for operation in the AC loopback testing mode. The delayed clock signals are subsequently transmitted to test pattern generator 210. Additionally, delay unit 203 is programmable in order to vary the delay of the core clock signals. According to one embodiment, delay unit 203 receives one or more delay select signals that indicate the magnitude delay unit 203 is to delay the clock signals.

MUX 205 is coupled to delay unit 203. MUX 205 receives an AC select signal that enables MUX 205 to select between the core clock signals and the delayed clock signals. During an AC loopback test, the select signal indicates that MUX 205 select the delayed clock signals to drive test pattern generator 210. However, during non-test conditions, or during a standard loopback test, the select signal indicates that MUX 205 select core clock signals. According to another embodiment, delay unit 203 and MUX 205 may be external to I/O test circuit 110. Moreover, one of ordinary skill in the art will appreciate that delay unit 203 and MUX 205 may be placed in other locations within I/O test circuit 110. For example, delay unit 203 and MUX 205 may be placed between MUX 225 and latch 230 in order to delay the propagation of data with respect to clock signals.

Test pattern generator 210 is coupled to MUX 205 and MUX 115, and is used to generate test pattern signals for testing I/O test circuit 100 upon the initiation of a loopback test. According to one embodiment, test pattern generator 210 may be implemented with two or more flip flops. However, test pattern generator 210 may be implemented using other circuitry such as a linear feedback register, a random pattern generator or random access memory (RAM). According to a further embodiment, the test pattern signals may be loaded into test pattern generator 210 from an integrated circuit tester (not shown) via a test chain prior to conducting a loopback test.

Stage unit 215 is coupled between test pattern generator 210 and compare unit 220 and receives test pattern signals from test pattern generator 210. According to one embodiment, stage unit 215 provides a one cycle delay for the test pattern signals before they are transmitted to compare unit 220 be compared with test signals received from amp 145. However, it will be appreciated that stage unit 215 may provide a higher magnitude of delay.

Compare unit 220 is coupled to stage unit 215 and amp 145. Compare unit 220 compares test signals received from stage unit 215 with test signals received from amp 145, after having passed through the components of I/O buffer 100. If compare unit 220 detects a difference between the signals received from amp 145 and those received from test pattern generator 210, an error signal is transmitted from compare unit 220. According to one embodiment, compare unit 220 may be implemented using an Exclusive-Or-Gate. Alternatively, other comparison logic may be used to implement compare unit 220.

MUX 225 is coupled to compare unit 220 and latch 230. MUX 225 selects signals from compare unit 220 whenever a loopback test is in progress at I/O buffer 110, and selects the scan chain path after the test pattern is complete. According to one embodiment, test pattern generator 210 generates an infinite repeating pattern. Nevertheless, test pattern generator 210 may generate patterns according to other methods.

Latch 230 is coupled to compare unit 220 and receives the error signal transmitted by compare unit 220 in cases where a difference is detected between the amp 145 signals and the signals received from stage unit 215. According to one embodiment, latch 230 is a boundary scan latch as described in the Institute of Electrical and Electronics Engineers (IEEE) 1149.1 Specification. Once an error signal is received, latch 230 remains set until the loopback test is completed. Latch 230 is subsequently examined as a part of a boundary scan chain.

Figure 5:
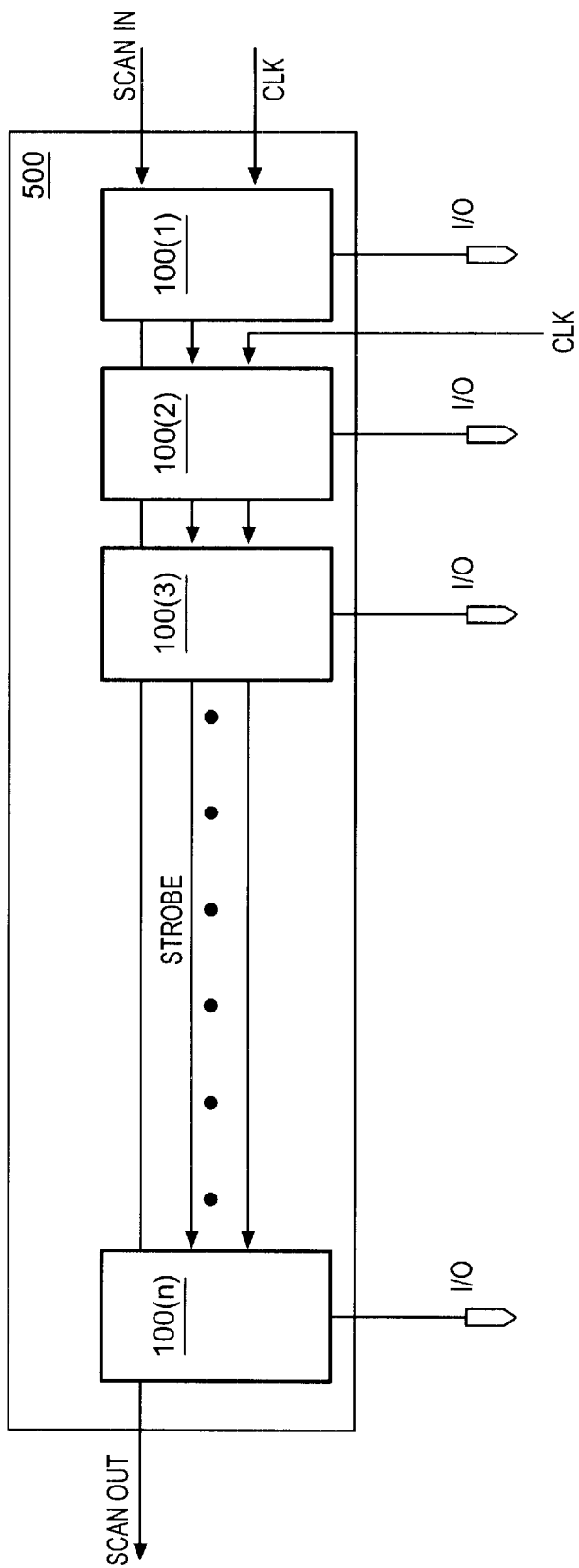
FIG. 5 is a block diagram of one embodiment of an integrated circuit including a multitude of I/O buffers.

FIG. 5 is a block diagram of one embodiment of an integrated circuit (IC) 500. IC 500 includes input/output (I/O) buffers 100(1)–100(n). I/O buffers 100(1)–100(n) make up a data block of I/O circuitry for transmitting to and receiving data from other IC 100 devices. According to one embodiment, a data block includes sixteen (16) I/O buffers 200. However, in other embodiments, a data block may include other multiples (e.g., 2, 4, 8, 12, 18, 32, 40, 64, etc.) of I/O buffers 100.

According to one embodiment, the data block of I/O buffers 100 operate as a source synchronous interface. Core clock and select signals are distributed to each I/O buffer 100 in a data block. In addition, a strobe clock is generated at I/O buffer 100(1) and distributed along with I/O data. According to one embodiment, the strobe clock generated at I/O buffer 100(1) is distributed to the remaining I/O buffers 100 (e.g., 100(2)–100(n)) in the data block during an AC I/O loopback test mode. According to one embodiment, I/O buffer 100(1) is placed in the center of the data group to minimize the routing length. Nevertheless, one of ordinary skill in the art will appreciate that I/O buffer 100(1) can be placed at any physical location.

During the normal mode of operation, the strobe clock is used for source synchronous data transactions. Source synchronous refers to interfaces wherein a receiving I/O buffer captures data based upon a strobe clock that is provided by another IC device driving the data. With careful control over the signal paths, the transfer rate of information can be maximized because the strobe edge can be accurately placed to minimize the skew relative to the data.

Figure 3:
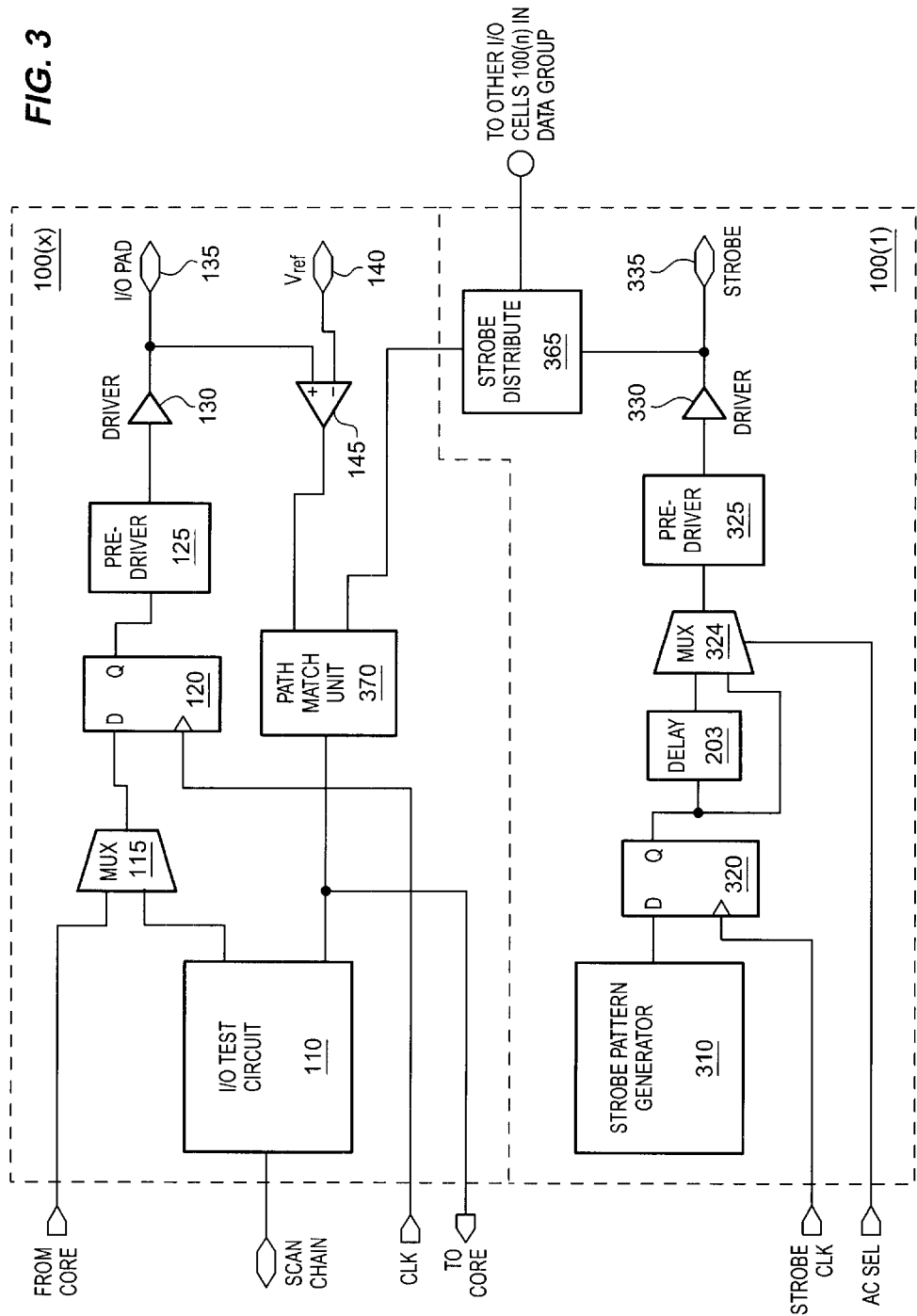
FIG. 3 is a block diagram of one embodiment of an input/output buffer for source synchronous operation.

FIG. 3 is a block diagram of one embodiment of I/O buffer 100 in a source synchronous interface. In this embodiment, I/O buffer 100 includes all of the components described above with respect to FIGS. 1 and 2 designated as 100(x), with the addition of a patch march unit 370. I/O buffer 100(x) represents any of I/O buffers 100(2)–100(n) in the data group described above with respect to FIG. 5. I/O buffer 100(1) includes a strobe pattern generator 310, a register 320, a delay unit 322, a MUX 324, a pre-driver 325, a driver 330, a strobe pad 335, a strobe distribution unit 365.

Strobe pattern generator 310 generates strobe pulses for source synchronous operation. Register 320 is coupled to strobe pattern generator 310. Register 320 stores data that is received from strobe pattern generator 310 in order to synchronize the strobe pulses with a strobe clock. Delay unit 322 provides a delay of strobe pulses generated at strobe pattern generator 310 for operation in the AC loopback testing mode. The delayed strobe low pulses are subsequently transmitted from I/O buffer 100(1). Additionally, delay unit 322 is programmable in order to vary the delay. According to one embodiment, delay unit 322 receives one or more delay select signals that indicate the magnitude delay unit 322 is to delay the clock signals.

MUX 324 is coupled to delay unit 322. MUX 324 receives an AC select signal that enables MUX 324 to select between the strobe pulses and the delayed pulses. During an AC loopback test, the select signal indicates that MUX 324 select the delayed pulses. However, during non-test conditions, or during a standard loopback test, the select signal indicates that MUX 324 select the strobe pulses. According to another embodiment, delay unit 322 and MUX 324 may be placed in other locations within I/O buffer 100(1). Pre-driver 325 is coupled to MUX 324. Pre-driver 325 transmits strobe signals that are to be transmitted from I/O buffer 100. Driver 330 is coupled to pre-driver 325 and operates by amplifying data signals received from pre-driver 325.

Strobe pad 335 is coupled to driver 330. In normal operation, strobe pad 335 transmits strobe pulses from I/O buffer 100 to other integrated circuit components. Strobe pad 335 also receives strobe pulses at I/O buffer 100 from other components. Strobe distribution unit 365 is coupled to driver 330 and distributes the test strobe pulses the other I/O buffers in the data block (e.g., buffers 100(2)–100($n$)). Strobe distribution unit 365 may also distributes strobe pulses received during the normal source synchronous receive operation.

Path match unit 370 in buffer 100($x$) is coupled to driver amp 145, strobe distribution unit 365 and compare unit 220. Path match unit 370 clocks data received from amp 145 into compare unit 220 using the test strobe pulses. In addition, path match unit 370 matches the delay provided by strobe distribution unit 365 in order to prevent a relative change in position between the test signals and the test strobe pulses.

Figure 4:
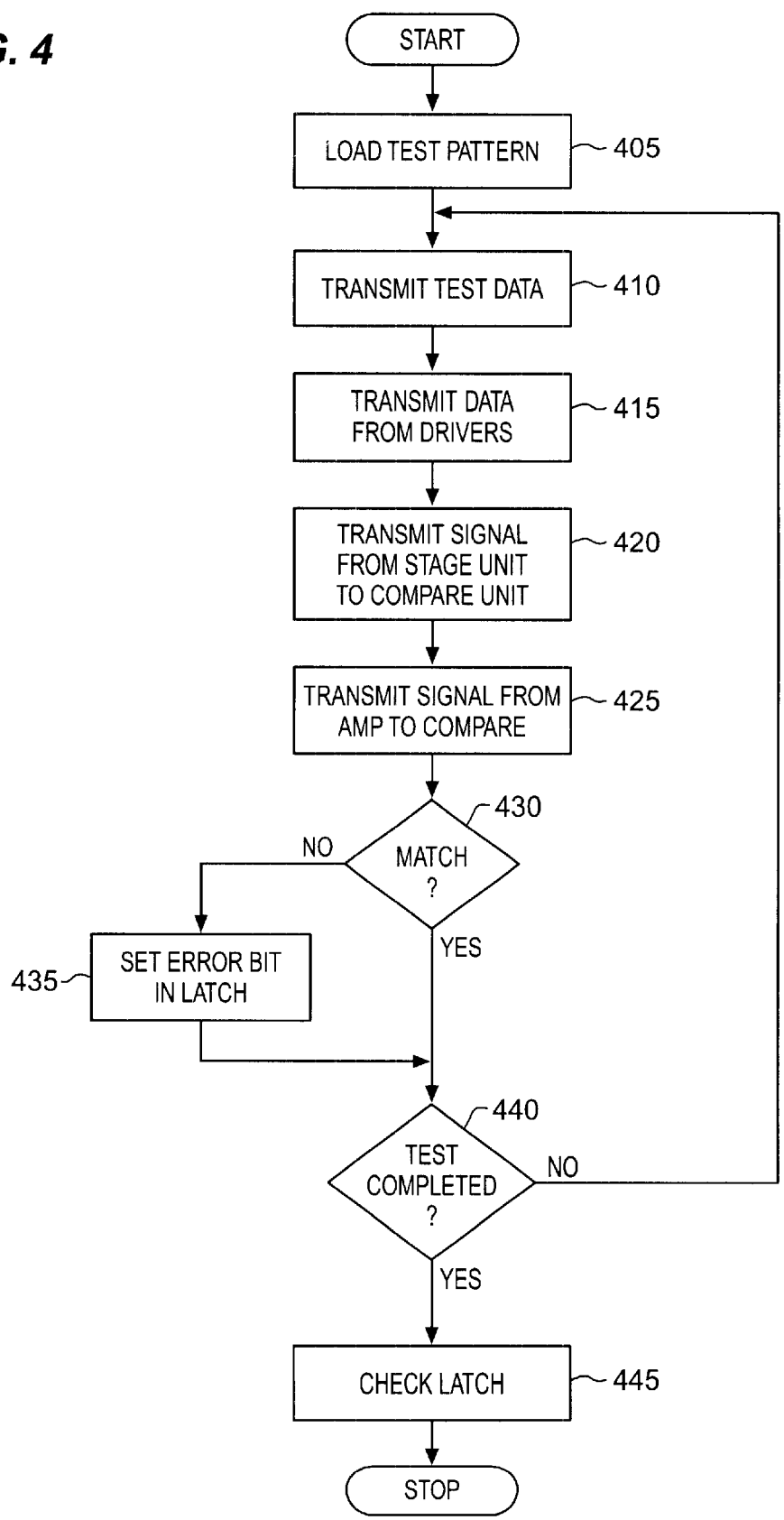
FIG. 4 is a flow control diagram for one embodiment of the operation of a loopback test at an input/output buffer.

FIG. 4 is a flow diagram for one embodiment of the operation of I/O buffer 100 while conducting a standard loopback test. At process block 405, test patterns are loaded into test pattern generator 210. At process block 410, a test signal is transmitted from test pattern generator 210 to MUX 115. Additionally, the test signal is transmitted to stage unit 215. Since a loopback test is being conducted at I/O buffer 100, MUX 115 selects the test data path, thus, enabling data to be transmitted from I/O test circuit 110 to the components of I/O buffer 100. The test signal received at MUX 115 is subsequently received at driver 130 after having passed through register 120 and pre-driver 125.

Further, a test strobe pulse may be transmitted from strobe pattern generator 310 through register 320 and pre-driver 325 to driver 330 if I/O buffer 100 is a source synchronous buffer. At process block 415, the test signal is transmitted from driver 130 to I/O pad 135 and amp 145. Also, the test strobe pulse may be transmitted from driver 330 to strobe output 335 and strobe distribution unit 365 in the source synchronous mode. At process block 420, the test signal that was transmitted to stage unit 215 (duplicate signal) is transmitted from stage unit 215 to compare unit 220. At process block 425, the test signal is transmitted from amp 145 to compare unit 220.

In the source synchronous mode, the test signal is transmitted from amp 145 to path match unit 370 and the test strobe pulse is transmitted from strobe distribution unit 365 to path match unit 370. Subsequently, the test signal is transmitted from path match unit 370 to compare unit 220. The duplicate signal received from stage unit 215 is compared with the test signal received from amp 145, or path match unit 370. At process block 430, it is determined whether the duplicate signal matches the test signal received from amp 145.

If it is determined that there is a mismatch between the two signals, a defect exists in I/O buffer 100 and an error signal is transmitted from compare unit 220 to latch 230, process block 435. At process block 440, it is determined whether the loopback test has been completed. After a sufficient number of test cycles have passed, latch 230 may be examined to determine whether a defect has been detected in I/O buffer 100, process block 445. If a sufficient number of test cycles have not passed, control is returned to process block 410 wherein a subsequent test signal is transmitted from test pattern generator 210 to MUX 115.

If it is determined that the test is complete, it is determined whether the loopback test has been completed, process block 440. If all of the test pattern signals have been issued (e.g., a sufficient number of test cycles have been run), latch 230 may be examined to determine whether a defect was detected in I/O buffer 100 during the transmission of previous test signals, process block 445. However, if all of the test pattern signals have not been issued (e.g., a sufficient number of test cycles have not been run), control is returned to process block 405 wherein a subsequent test signal is transmitted from test pattern generator 210.

One of ordinary skill in the art will recognize that process blocks 415 and 425 may be processed in a variety of different sequences. For example, the process disclosed in process block 425 may be executed before the process in process block 415. Alternatively, process blocks 415 and 425 may be executed in parallel.

According to one embodiment, I/O buffers 100(1) and 100($n$) support AC I/O loopback testing. Although I/O buffer 100 may be determined to be functional after a standard I/O loopback test, an AC loopback test provides the capability of detecting more subtle defects in the components of I/O buffer 100 that may effect timing. Thus, conducting an AC I/O loopback test examines the AC I/O loopback of the input and output paths of I/O buffer 100($x$).

According to one embodiment, the AC loopback test includes a first fail test, an all fail test and a difference test. The first fail test determines whether the path delay of the I/O buffers 100($x$) meet the designed time valid after (Tva) output specification and hold time (Th), input specification. According to one embodiment, the first fail test is implemented by delaying the strobe pulses generated at strobe pattern generator 310. As described above, the delay is implemented by programming delay unit 322) until a first I/O buffer 100($x$) of a particular data group (e.g., 100(2) –100($n$)) fails. First a predetermined delay is programmed into delay unit 322. Subsequently, test data generated at test pattern generator 210 is received at register 320. The test data is propagated through the output path back to amp 145 where it is to be latched into path match unit 370.

If the delay of the test data through the I/O paths to path match unit 370 exceeds I/O buffer 100($x$) specifications the test data will not be latched into path match unit 370.

Accordingly, the data will not be received at latch 230. A particular I/O buffer 100(*x*) will be considered to have failed the test if the expected test data is not received at latch 230. The delay at which the first I/O buffer 100(*x*) fails is then compared to a criteria that is based on the Tva+Th specifications for the particular I/O buffer 100(*x*). If the delay time at which the buffer 100(*x*) failed is less than the criteria, the buffer 100(*x*) and IC 500 is considered to be defective.

The all fail test determines whether the path delay of the I/O buffers 100(*x*) is so large that it exceeds the receiver's setup time (Tsu) specification or the time valid before (Tvb) output specification for a subsequent data cycle. According to one embodiment, the all fail test is implemented by delaying the strobe pulses generated at output strobe generator 320 until all I/O buffers 100(*x*) of a data group fail. The point at which all of the buffers 100(*x*) fail, in effect, indicates the time at which the last I/O buffer 100(*x*) failed. Again, the time at which the last I/O buffer 100(*x*) fails is compared to a criteria that is based on the design specifications (Tvb +Tsu). If the delay time is greater than the criteria, the time at which the last buffer 100(*x*) has completed a data transaction will interfere with the setup time for the ensuing transaction. As a result, the buffer 100(*x*) and IC 500 is considered to be defective.

The difference test is applied to measure the difference in delay between the first fail test and the all fail test. The window of time between the first fail test and the all fail test must also meet design specifications for the data group as failing this could indicate the presence of defect that may go undetected using only the first fail and all fail tests detailed above.

A common clock AC loopback test at I/O buffer 100 described in FIG. 1, is conducted by first programming the fixed delay into delay unit 203 such that all outputs of I/O buffer 100 fail the test (all fail test). In this embodiment, latch 230 may be configured to capture multiple test signals in order to determine whether an error has been detected for each test signal generated at test pattern generator 210. Subsequently, the delay is reduced to the point at which the first output passes from I/O buffer 100 (first fail test). Afterward, the delay is further reduced until all of the outputs pass. The range of delay between the first fail test and the all fail test discloses the relative health of the fastest and slowest buffers in I/O buffer 100.

Referring back to FIG. 5, is a block diagram of one embodiment of an integrated circuit 500 including a multitude of I/O buffers 100. According to one embodiment, a loopback test is conducted at I/O buffers 100(1)–100(*n*) simultaneously. After all of the loopback tests have been completed, latch 230 of each I/O buffer may be examined to determine whether an error has been detected in any of the buffers. Alternatively, all of the I/O buffers 100 may be tested sequentially.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

Therefore, a method and apparatus for performing an I/O loopback test has been described.

What is claimed is:

1. In an integrated circuit including a plurality of input/output (I/O) buffers, a first I/O buffer comprising:

a first I/O pad;

a first output driver coupled to the first I/O pad;

a first input receiver coupled to the first I/O pad; and a first I/O test circuit coupled to the first output driver and the first input receiver, wherein the first I/O test circuit generates test pattern signals whenever the first I/O buffer is operating in a test mode.

2. The integrated circuit of claim 1 wherein the test pattern signals are transmitted from the first output buffer and received at the first input receiver to generate loopback pattern signals.

3. The integrated circuit of claim 2 wherein the first I/O test circuit compares the loopback pattern signals to the test pattern signals.

4. The integrated circuit of claim 3 wherein the first I/O test circuit further generates a first error signal if the loopback pattern signals do not match the test pattern signals.

5. The integrated circuit of claim 4 wherein the first I/O test circuit comprises:

a test pattern generator for generating the test pattern signals;

a comparator coupled to the test pattern generator; and a latch coupled to the comparator for storing the error signal.

6. The integrated circuit of claim 1 wherein the first I/O buffer further comprises:

a first pre-driver coupled to the first output driver;

a first register coupled to the first pre-driver; and a first multiplexer coupled to the first register and the I/O test circuit.

7. The integrated circuit of claim 1 further including a second I/O buffer, wherein the second I/O buffer comprises:

a second I/O pad;

a second output driver coupled to the second I/O pad;

a second input receiver coupled to the second I/O pad; and a second I/O test circuit coupled to the second output driver and the second input receiver, wherein the second I/O test circuit generates test pattern signals whenever the second I/O buffer is operating in a test mode.

8. The integrated circuit of claim 7 wherein the first and second I/O buffers are common clock I/O buffers.

9. The integrated circuit of claim 1 wherein the first I/O buffer is adaptable to perform switching state (AC) loopback tests by varying the propagation of test pattern signals through the first I/O buffer with respect to the reception of clock pulses.

10. The integrated circuit of claim 9 wherein the I/O test circuit comprises a programmable delay element for delaying the reception of clock pulses.

11. The I/O buffer of claim 1 wherein the I/O test circuit compares the test data signals to the test pattern signals.

12. The I/O buffer of claim 11 wherein the I/O test circuit further generates an error signal if the test data signals do not match the test pattern signals.

13. The I/O buffer of claim 12 wherein the I/O test circuit comprises:

a test pattern generator for generating the test pattern signals and the test data signals;

a comparator coupled to the first test pattern generator; and a latch coupled to the comparator for storing the error signal.

14. An integrated circuit comprising:

a first input output (I/O) buffer for generating strobe clock pulses; and a second I/O buffer coupled to the first I/O buffer, wherein the second I/O buffer generates test pattern signals whenever the integrated circuit is operating in a loopback test mode.

15. The integrated circuit of claim 14 wherein the second I/O buffer is operable to conduct switching state (AC) loopback tests wherein the generation of strobe clock pulses is varied with respect to test pattern signals received at the first I/O buffer.

16. The integrated circuit of claim 15 wherein the first I/O buffer comprises:
   a strobe pattern generator;
   a first multiplexer coupled to the strobe pattern generator;
   a first register coupled to the multiplexer;
   a second pre-driver coupled to the first register; and
   a first output driver coupled to the first pre-driver.

17. The integrated circuit of claim 16 wherein the first I/O buffer comprises a programmable delay element for delaying the transmission strobe clock pulses from the first I/O buffer.

18. The integrated circuit of claim 14 wherein the second I/O buffer comprises:
   a first I/O pad;
   a second output driver coupled to the second I/O pad;
   a second input receiver coupled to the second I/O pad; and
   a first I/O test circuit coupled to the second output driver and the second input receiver, wherein the first 1O test circuit generates the test pattern signals.

19. The integrated circuit of claim 14 further comprising a third I/O buffer coupled to the first I/O buffer, wherein the third I/O buffer generates test pattern signals whenever the integrated circuit is operating in a loopback test mode.

20. A method of conducting a loop back test in an integrated circuit comprising:
   generating a first test signal at a first pattern generator circuit in a first input/output (110) buffer;
   transmitting the first test signal from a first output driver in the first I/O buffer;
   receiving the first test signal at a first input receiver in the first I/O buffer;
   determining whether the first test signal received at the first input receiver is the equivalent to the first test signal as generated at the first pattern generator circuit; and
   if not, transmitting an error signal.

21. The method of claim 20 wherein the process of determining whether the first test signal received at the input receiver is the equivalent to the first test signal as generated at the first pattern generator circuit further comprises:
   transmitting the first test signal from the first input receiver to a comparator in the first I/O buffer;
   transmitting the first test signal from the first pattern generator circuit to a first delay unit;
   transmitting the first test signal from the first delay unit to the comparator; and
   comparing the first test signal from the first input receiver to the first test signal received from the first delay unit.

22. The method of claim 21 further comprising:
   generating a first test clock pulse at a strobe pattern generator in the first I/O buffer;
   receiving the first test clock pulse at a path match circuit in the first I/O buffer;
   receiving the first test signal at the path match circuit after the first test signal is transmitted from the first input receiver; and
   transmitting the first test signal to the comparator.

23. The method of claim 22 further comprising:
   receiving the first test strobe pulse at a strobe delay circuit in the first I/O buffer after the first test strobe signal has been generated; and
   transmitting the first test strobe pulse from the strobe delay circuit to the path match circuit.

24. The method of claim 21 further comprising:
   generating a second test signal at the first pattern generator circuit;
   transmitting the second test signal from the first output;
   receiving the second test signal at the first input receiver;
   transmitting the second test signal from the first input receiver to the comparator;
   transmitting the second test signal from the first pattern generator circuit to the first delay unit;
   transmitting the second test signal from the first delay unit to the comparator; and
   comparing the second test signal from the first input receiver to the second test signal received from the first delay unit to determine whether they are equivalent; and
   if not, transmitting an error signal.

25. The method of claim 21 further comprising
   generating a second test signal at a second pattern generator circuit in a second input/output (I/O) buffer;
   transmitting the second test signal from a second output driver in the second I/O buffer;
   receiving the second test signal at a second input receiver in the second I/O buffer;
   determining whether the second test signal received at the second input receiver is the equivalent to the second test signal as generated at the second pattern generator circuit; and
   if not, transmitting an error signal.

26. The method of claim 25 wherein the process of determining whether the second test signal received at the input receiver is the equivalent to the second test signal as generated at the second pattern generator circuit further comprises:
   transmitting the second test signal from the second input receiver to a second comparator in the second I/O buffer;
   transmitting the second test signal from the second pattern generator circuit to a second delay unit;
   transmitting the second test signal from the second delay unit to the second comparator; and
   comparing the second test signal from the second input receiver to the second test signal received from the second delay unit.

27. The method of claim 20 wherein the process of determining whether the first test signal received at the input receiver is the equivalent to the first test signal as generated at the first pattern generator circuit further comprises:
   transmitting the first test signal from the first pattern generator circuit to a first delay unit;
   transmitting the first test signal from the first input receiver to a comparator in the first I/O buffer;
   transmitting the first test signal from the first delay unit to the comparator; and
   comparing the first test signal from the first input receiver to the first test signal received from the first delay unit.

28. The method of claim 20 further comprising transmitting the error signal to a latch.

29. An input/output (I/O) buffer comprising:

an I/O pad;

an output driver coupled to the I/O pad;

an input receiver coupled to the I/O pad; and an I/O test circuit, coupled to the output driver and the input receiver, that generates test pattern signals and test data signals corresponding to the test pattern signals whenever the integrated circuit is operating in a test mode.

30. A method of conducting a switching state (AC) loop back test at a buffer circuit comprising:

varying the relationship between the generation of strobe signals at a strobe input/output (I/O) circuit of a first group of I/O circuits and the reception of data at the first group of I/O circuits until a first I/O circuit of the first group of I/O circuits receiving the strobe signals fail;

comparing the time at which the first I/O circuit fails with predetermined timing performance for the first group of I/O circuits; and determining whether the first group of I/O circuits satisfies the predetermined timing performance.

31. The method of claim 30 further comprising:

varying the relationship between the generation of strobe signals at the strobe I/O circuit of the first group of I/O circuits and the reception of data at the first group of I/O circuits until a last I/O circuit of the first group of I/O circuits fails;

comparing the time at which the last I/O circuit fails with the predetermined timing performance for the first group of I/O circuits; and determining whether the first group of I/O circuits satisfies the predetermined timing performance.

32. The method of claim 31 further wherein varying the relationship between the generation of strobe signals and the reception of data comprises delaying the propagation of strobe signals.

33. The method of claim 32 further comprising:

determining the difference between the delay required for the failure of the second I/O circuit and the delay required for the failure of the last I/O circuit of the first group of I/O circuits;

comparing the difference with the predetermined timing performance for the first group of I/O circuits; and determining whether the first group of I/O circuits satisfies the predetermined timing performance.

34. A method of conducting a switching state (AC) loop back test at a buffer circuit comprising:

varying the propagation of test data signals with respect to the reception of a common clock at a first group of input/output (I/O) circuits until a first I/O circuit of the first group fails;

comparing the time at which the first I/O circuit fails with predetermined timing performance for the first group of I/O circuits; and determining whether the first group of I/O circuits satisfies the predetermined timing performance.

35. The method of claim 34 further comprising:

varying the propagation of test data signals with respect to the reception of a common clock at the first group of I/O circuits until a last I/O circuit of the first group fails;

comparing the time at which the last I/O circuit fails with the predetermined timing performance for the first group of I/O circuits; and determining whether the first group of I/O circuits satisfies the predetermined timing performance.

36. The method of claim 35 further wherein varying the propagation of test data signals with respect to the reception of a common clock comprises delaying the propagation of the test data.

37. The method of claim 36 further comprising:

determining the difference between the delay required for the failure of the first I/O circuit and the delay required for the failure of the last I/O circuit of the first group of I/O circuits;

comparing the difference with the timing specifications for the first group of I/O circuits; and determining whether the first group of I/O circuits satisfies the predetermined timing performance.

* * * * *

UNITED STATES PATENT AND TRADEMARK OFFICE
CERTIFICATE OF CORRECTION

PATENT NO.  : 6,477,674 B1
DATED       : December 29, 1999
INVENTOR(S) : Bates et al.

It is certified that error appears in the above-identified patent and that said Letters Patent is hereby corrected as shown below:

<u>Column 5,</u>
Line 8, before "pulses", delete "low".

<u>Column 9,</u>
Line 36, delete "110", insert -- I/O --.

Signed and Sealed this

First Day of July, 2003

JAMES E. ROGAN
*Director of the United States Patent and Trademark Office*